United States Patent
Sagara et al.

(10) Patent No.: US 6,933,050 B2
(45) Date of Patent: Aug. 23, 2005

(54) EPOXY RESIN COMPOSITIONS CONTAINING PHOSPHORUS, FLAME RETARDANT RESIN SHEET USING SAID EPOXY RESIN CONTAINING PHOSPHORUS, RESIN CLAD METAL FOIL, PREPREG AND LAMINATED BOARD, MULTI LAYER BOARD

(75) Inventors: Takashi Sagara, Kadoma (JP); Toshiharu Takata, Kadoma (JP); Kiyoaki Ihara, Kadoma (JP); Hidetaka Kakiuchi, Kadoma (JP); Kazuo Ishihara, Edogawa-ku (JP); Chiaki Asano, Edogawa-ku (JP); Masao Gunji, Edogawa-ku (JP); Hiroshi Sato, Edogawa-ku (JP)

(73) Assignees: Matsushita Electric Works, Ltd., Osaka (JP); Tohto Kasei Co., Ltd., Tokyo (JP)

( * ) Notice: Subject to any disclaimer, the term of this patent is extended or adjusted under 35 U.S.C. 154(b) by 0 days.

(21) Appl. No.: 10/359,205

(22) Filed: Feb. 6, 2003

(65) Prior Publication Data
US 2003/0162935 A1 Aug. 28, 2003

Related U.S. Application Data

(63) Continuation of application No. 09/688,033, filed on Oct. 12, 2000, now Pat. No. 6,524,709.

(30) Foreign Application Priority Data

Apr. 6, 2000 (JP) ......................................... 2000-104284

(51) Int. Cl.$^7$ .................... B32B 27/38; B32B 27/04; B32B 15/08; C08L 63/00

(52) U.S. Cl. .................... 428/416; 428/297.4; 428/413; 428/414; 428/418; 523/400; 528/99

(58) Field of Search .................... 428/413, 414, 428/416, 418, 297.4; 528/99, 112, 119, 121, 124; 525/480, 481, 523, 533; 523/400, 440

(56) References Cited

U.S. PATENT DOCUMENTS 6,180,695 B1 * 1/2001 Ito et al. ...................... 523/451
6,291,626 B1 * 9/2001 Wang et al. .................. 528/99

\* cited by examiner

Primary Examiner—Michael J. Feely
(74) Attorney, Agent, or Firm—Sherman & Shalloway

(57) ABSTRACT

The present invention features phosphorus containing epoxy resin compositions useful for imparting flame retardant properties to prepregs, resin-clad metal foils, and laminate boards constructed therefrom. The phosphorus containing epoxy resin composition (a) comprises a phosphorus containing epoxy resin (A) and a hardener. The phosphorus containing epoxy resin (A) has an epoxy equivalent of 300–500 g/eq. and comprises the reaction product of a phosphorus containing organic compound (B) and at least one epoxy resin (C). Phosphorus containing compound (B) is the reaction product of organic phosphorus compounds (b) having one active hydrogen atom bonded to a phosphorus atom and a quinone compound, wherein the molar ratio of (b) to quinone is from 1.25:1 to 2:1. This molar excess of (b) yields a phosphorus containing compound (B) that comprises both the reaction product of (b) and quinone, as well as un-reacted (b). Epoxy resin (C) is selected from a group of specific aromatic-containing epoxy resins, and the content of epoxy resin (C) comprises from 20 to 45 wt. % of (A).

25 Claims, No Drawings

US 6,933,050 B2

EPOXY RESIN COMPOSITIONS CONTAINING PHOSPHORUS, FLAME RETARDANT RESIN SHEET USING SAID EPOXY RESIN CONTAINING PHOSPHORUS, RESIN CLAD METAL FOIL, PREPREG AND LAMINATED BOARD, MULTI LAYER BOARD

CROSS-REFERENCE TO RELATED APPLICATION

This application is a continuation of application Ser. No. 09/688,033, filed on Oct. 12, 2000, now issued as U.S. Pat. No. 6,524,709, which claims priority from Japanese application 2000-104284 filed Apr. 6, 2000.

BACKGROUND OF THE INVENTION

1. Field of the Invention

The present invention relates to a new type of phosphorus containing epoxy resin compositions with flame retardant and a resin sheet.resin clad metal foil.prepreg.laminated board.multi layer board used for an electric circuit board containing said epoxy resin.

2. Description of the Prior Art

To copper clad laminates, which are in use for electronic or electric apparatus and devices, the measures such as fire prevention or retardation are strongly required. Therefore, halogenated epoxy resins that have flame retardance are usually in use for copper clad laminates. Especially, among halogen group of atoms, by introducing bromine into epoxy resin, an excellent flame resistance can be provided to the epoxy resin and its cured product that has highly reactive epoxy groups and characteristics can be obtained, therefore, the halogenated epoxy resins, especially brominated epoxy resins are known to useful material for electronic or electric devices. However, when these halogenated epoxy resin are used at high temperatures for a long term, they can be dissociated to form halogen compounds such as hydrogen halogenide and halogen, and subsequently might be a danger to occurring corrosion problem for wires, and such actual accidents have been already reported. Furthermore, it is pointed out that toxic chemical substances such as dioxin and hydrogen halogenide could be formed to incur a serious environmental problem. When used parts of electric and (or) electronic devices will be calcined. This indicates that use of halogen containing flame retardant could result in such environmental problem. Considering the present situation of epoxy resin composition, the research to develop a new epoxy resin compositions substitute for halogenated epoxy resins is highly required. Under the current situation, the development and commercialization of a flame retardant epoxy resin not containing any halogen and a copper clad laminated for printed wiring applications using that said flame retardant epoxy resin can be said as a subject to meet the current requirement of the era.

BRIEF ILLUSTRATION OF THE INVENTION

The inventors of this invention have studied intensively to develop a new type of flame retardant epoxy resins not containing any halogen and a copper clad laminated for printed wiring applications using the said flame retardant epoxy resin, and aimed a basic theory of flame retardance by phosphorus and phosphorus compound disclosed in pages 49, 52–59 of "Flame Retardation of Polymer" (published by Taiseisha, 1989, Tokyo, Japan. Hitoshi Nishizawa). And the inventors of this invention have found that the new flam retardant phosphorus containing epoxy resin composition that said basic theory is applicable and can be obtained only by the use of a specific organic phosphorus compound, and furthermore, the resin compositions obtained by containing specific epoxy resin as an essential component indicate an excellent flame retardance, and physical properties of its cured products are suitable for printed wiring applications. Thus, we accomplished the present invention.

As disclosed in EP 0 806429A2, as the flame retardant epoxy resin is not using any halogen, which phosphorus containing organic compounds with epoxy group which are prepared from organic phosphorus compounds and epoxy resins have been investigated, however, when bifunctional epoxy resins are used as starting material, the concentration of epoxy group, which is a reactive functional group, will become lower, and lowering of heat resistance as the hardened epoxy resin is pointed out as a problem. Furthermore, for example, the viscosity of a phosphorus containing epoxy resin obtained from organic phosphorus compounds and epoxy resins, which has been disclosed in JP4-11662A, is too high to use it fence, it is required to decrease in actual viscosity by adding another liquid epoxy resin with lower viscosity. Therefore, generally the epoxy resin compositions using this kind of epoxy resin has a problem that the phosphorus content will be lowered in the composition. More ever, an epoxy resin containing phosphorus disclosed in JP11-166035A can be obtained from an organic phosphorus compound and epoxy resins, however this has a problem to decrease in heat resistance and adhesion.

The present invention is aimed to solve the above mentioned problem, and the aim of this invention is to provide a flame retardant epoxy resin composition that contains phosphorus and epoxy groups having excellent flame retardance, heat resistance and adhesion which is useful for printed wiring applications, including a resin sheet, resin clad copper (RCC), prepreg, copper clad laminate and build-up wiring board.

DETAILED DESCRIPTION OF THE INVENTION

That is, the important point of this invention is a phosphorus containing epoxy resin compositions, comprising an epoxy resin composition (a) in which a phosphorus containing epoxy resin (A) and a hardener are contained, wherein said phosphorus containing epoxy resin (A) is a phosphorus containing resin compositions prepared by reacting phosphorus containing organic compounds (B) obtained by the reaction in the range of molar ratio of 1.01 to 2 moles of organic phosphorus compounds (b) having one active hydrogen atom bonded to phosphorus atom with 1 mole of quinone compounds, with at least one kind of epoxy resins (C) selected from the group composed of general formula 1, general formula 2 or general formula 3 so as the content of said epoxy resins (C) is from 20 to 45 wt. %.

The other composition of this invention, using of novolac type epoxy resins for such as kind of epoxy resin (C) and the above mentioned epoxy resin (A) is prepared by reacting phosphorus containing organic compounds (B) obtained by the reaction in the range of molar ratio of greater than 0 mole to smaller than 1 mole of quinone compounds with 1 mole of organic phosphorus compounds (b) having one active hydrogen atom bonded to phosphorus atom, with novolac type epoxy resin so as content of the said epoxy resin (C) to be more than 20 wt. %. Furthermore, the another important point of this invention is a flame retardant epoxy resin composition containing a phosphorus with epoxy resin characterized by using the said phosphorus containing epoxy resin compositions and total content of phosphorus in whole resin composition is in the range of 0.5 to 4 wt. %.

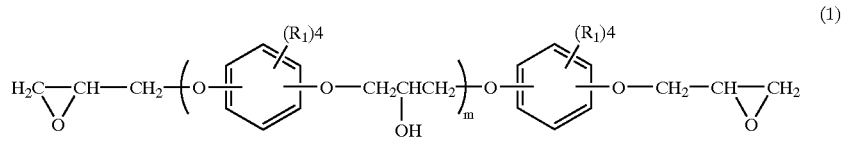

(1)

wherein $R_1$ is a hydrogen atom and/or a phenyl group, m is an integer including 0,

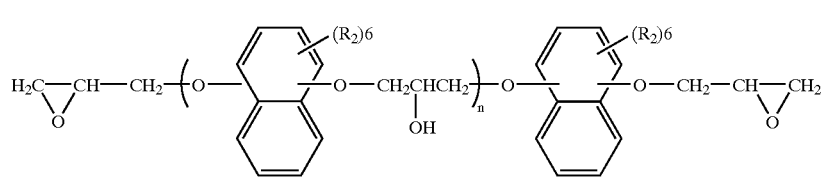

(2)

wherein $R_2$ is a hydrogen atom and/or a phenyl group, n is an integer including 0,

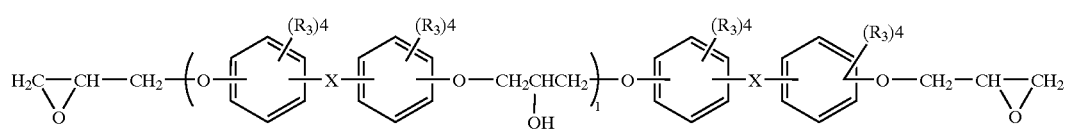

(3)

wherein $R_3$ is a hydrogen atom and/or a phenyl group, l is an integer including 0,
and, X is $-CH_2-$, $-O-$, $-CO-$, $-SO_2-$, $-S-$, $-CH(C_6H_5)-$, $-C(C_6H_5)_2-$, not existing function group or chemical formula 4.

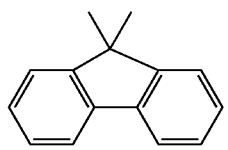

(4)

other important applications of the present invention are resin sheet, resin clad copper, prepreg to be impregnated into and coated to the sheet type inorganic and organic substrate and resin sheet thereof and printed wiring board.build-up printed wiring one obtained with heating and curing the said prepreg.

The present invention will be illustrated more in detail.

As illustrative examples of quinone compounds for present invention, 1,4-benzoquinone, 1,2-benzoquinone or 1,4-naphtoquinone can be mentioned. These of quinone compounds can be used alone or can be used together with, in addition, not intended to be limited to them.

As illustrative example of an organic phosphorus compound (b) having one active hydrogen atom bonded to phosphorus atom of present invention, 3,4,5,6,-dibenzo-1, 2-oxaphosphane-2-oxide (abbreviated to HCA, a product of Sanko Chemicals Co., Ltd. Osaka, Japan), diphenylphosphineoxide or others can be mentioned. These of organic phosphorus compounds (b) can be used alone or can be used together with, in addition, not intended to be limited to them.

The reaction of quinone compounds with organic phosphorus compounds (b) having one active hydrogen atom bonded to phosphorus atom can be carried out, for example, by the methods disclosed in JP5-214068A, Zh. Obshch. Khim. 42(11) 2415–2418 (1972), which is a common chemical magazine of Russia, JP60-126293A, JPG1-236787A or JP5-331179A. However, in the present invention, from 1.01 to 2 moles, desirably from 1.01 to 1.5 moles, more desirably from 1.01 to 1.4 moles of organic phosphorus compounds (b) having one active hydrogen atom bonded to phosphorus atom should be reacted with 1 mole of quinone compound, and when the molar ratio is over 2 moles, the reaction between epoxy group and organic phosphorus compounds (b) having one active hydrogen atom bonded to a phosphorus atom takes place and consequently the large amount of component which does not have epoxy group, which is a bridging site to a hardener, is formed and decrease in it's the heat resistance and adhesion. On the contrary, when the molar ratio of organic phosphorus atom is smaller than 1.01 to 1 mole of quinone compound, these of two reactants do not proceed along with the suitable direction, and organic phosphorus compounds (b) or quinone compounds remains. Especially, if there still remains a sublimate quinone, it will affect physical properties such as heat resistance because the sublimate quinone does not have a reactive group that reacts with epoxy resin.

The reaction of quinone compound with organic phosphorus compounds (b) having one active hydrogen atom bonded to phosphorus atom is carried out as follows:

At first, an organic phosphorus compound (b) is dissolved in an inactive solvent, and then a quinone compound is added to the solution and heated with constant stirring so as to proceed the reaction completely. As illustrative examples of the inactive solvent, methanol, ethanol, isopropanol, chloroform, N,N'-dimethylformamide, dioxane, ethyleneglycol, methoxypropanol, ethylcellosolve, benzene, toluene or xylene can be mentioned and any kind of solvents that can solve the organic phosphorus compound (b) can be used, and not intended to be limited to the mentioned solvents. However, among the quinone compounds, some kinds of them contain small amount of organic acid's such as maleic anhydride or phthalic anhydride as an impurity, and when a solvent that has alcoholic hydroxyl group is used, these impurity acids react with alcoholic hydroxyl group of the solvent could results in forming the substance which does not take part in epoxy curing and it might decrease in heat resistance of cured epoxy product. Therefore, use of dioxane, benzene, toluene or xylene is more desirable. Quinone compounds are used in the form of powder or its solution. As above mentioned reaction of quinone and organic phosphorus compound is exothermic, required quantity of quinone is divided to small parting and added or by titration method of its solution to avoid quick rising of temperature. After its addition, the reaction mixture of the above quinone and organic phosphorus will keep for 1–4 hours at the temperature range of 50 to 150° C.

As an illustrative example of epoxy resins (C) represented by general formula 1 of this invention, Epotohto ZX-1027 (hydroquinone type epoxy resin, a product of Tohto Kasei Co., Ltd. Tokyo, Japan) can be mentioned, however not intended to be limited to this resin. As an illustrative example of epoxy resin (C) represented by general formula 2 of this invention, Epotohto ZX-1355 (1,4-dihydroxy naphtalene type epoxy resin, a product of Tohto Kasei Co., Ltd. Tokyo, Japan) can be mentioned, however not intended to be limited to this resin. As the illustrative example of epoxy resins (C) represented by general formula 3 of this invention, Epotohto YDF-170 and YDF-8170 (bisphenol F type epoxy resins, a products of Tohto Kasei Co., Ltd. Tokyo, Japan), Epotohto ZX-1251 (bisphenol epoxy resin, a product of Tohto Kasei Co., Ltd. Tokyo, Japan), Epotohto ZX-1201 (bisphenol fluorene type epoxy resin, a product of Tohto Kasei Co., Ltd. Tokyo, Japan), ESLV-80DE (diphenylether type epoxy resin, a product of Shin Nittetu Chemicals Co., Ltd. Tokyo, Japan) or ESLV-50TE (diphenylsulfide type epoxy resin, a product of Shin Nittetsu Chemicals Co., Ltd. Tokyo, Japan) can be mentioned, however not intended to be limited to these resins.

The epoxy resin (C) of general formula 1, general formula 2 and general formula 3 can be used alone or can be used together with each other, and the mixing ratio is from 20 to 45 wt. % to 100 wt. % of the phosphorus containing epoxy resin, desirably is from 20 to 43 wt. % and more desirably is from 20 to 41 wt. %. If the mixing ratio is smaller than 20 wt. %, adhesive strength, especially, adhesive strength between copper clad laminates will lower, and if the mixing ratio is over 45 wt. %, it will results in lowering heat resistance of cured product of the above composition.

As the illustrative example of novolac type epoxy resins of this invention, Epotohto YDPN-638 (phenol novolac type epoxy resin, a product of Tohto Kasei Co., Ltd. Tokyo, Japan), Epotohto YDCN-701, YDCN-702, YDCN-703, YDCN-704 (ortho-cresol novolac type epoxy resins products of Tohto Kasei Co., Ltd. Tokyo, Japan), Epotohto ZX-1071T, ZX-1270, ZX-1342, (alkylation novolac type epoxy resins products of Tohto Kasei Co., Ltd. Tokyo, Japan), Epotohto ZX-1142L (naphtol novolac type epoxy resin a product of Tohto Kasei Co., Ltd. Tokyo, Japan), bisphenol novolac type epoxy resin, and aralkyl novolac type epoxy resin can be mentioned, however not intended to be limited to these resins.

The above mentioned novolac type epoxy resins can be used alone or can be used together with other ones or each other.

If the total content of the epoxy resins (C) of general formula 1, general formula 2 and general formula 3 is within the limit of from 20 to 45 wt. % in the above composition. Other kind of epoxy resins may be additionally used. As the other kind of epoxy resins, epoxies having more than 2 epoxy groups in 1 molecular resin, concretely, bisphenol type epoxy resin except general formula 3, resolcinol type epoxy resins, polyglycol type epoxy resins, trifunctional type epoxy resins, tetrafunctional type epoxy resins and novolac type epoxy resin can be mentioned, however, not intended to be limited to them.

The reaction between phosphorus containing organic compound (B), which can be obtained by reacting quinone compounds with organic phosphorus compounds (b) having one active hydrogen atom bonded to phosphorus atom, and epoxy resins (C) containing at least one selected from the groups composed of general formula 1, general formula 2 and general formula 3 can be carried out by well-known conventional method. That is, epoxy resins (C) is added to phosphorus containing organic compound (B), heated to reaction temperature of 100–200° C., desirably 120–180° C., with constant stirring so as to proceed the reaction completely. If the reacting rate is too slow, for the purpose to improve productivity, a suitable catalyst can be used to increase in productivity or to promote the reaction if required. As concrete examples of the catalyst, tertiary amine such as benzyldimethylamine, quaternary ammonium salts such as tetramethylammoniumchroride, phosphines such as triphenylphosphine, tris(2,6-dimethoxyphenyl) phosphine, phosphonium salts such as ethyltriphenylphosphoniumbromide, ethyltriphenyl phosphoniumiodide, or imidazole such as 2-methylimidazole or 2-ethyl-4-methylimidazole can be mentioned.

The desirable phosphorus content of phosphorus containing epoxy resin (A) of this invention is 1.2–4 wt. %, more desirably 2–3.1 wt. %. And the desirable phosphorus content of organic component in a flame retardant resin composition that contains phosphorus containing epoxy resin (A) is 0.5–4 wt. %, more desirably 1.5–3.5 wt. %, further, desirably 1–3 wt. %. If the phosphorus content of organic component in a flame retardant resin composition is smaller than 0.5 wt. %, it is difficult to maintain sufficient flame retardance, and if over 5 wt. %, heat resistance will be not expected more than one to meet increase in the phosphorous content, therefore, it is desirable to adjust the content of it to 0.5 to 4 wt. %.

The desirable epoxy equivalent of phosphorus containing epoxy resin (A) of this invention is 200–600 g/eq, more desirably 250–550 g/eq, further more desirably 300–500 g/eq. If the epoxy equivalent is smaller than 200 g/eq, the adhesion will be not sufficient, and if over than 500 g/eq, the heat resistance will lower, therefore, it is desirable to adjust it to 200 to 600 g/eq.

As hardener used for the compositions of this invention, conventional hardeners used for epoxy resins, for example, various kinds of phenol resins, acid anhydrides, amines, hydrazides or acidic polyesters can be used. These hardeners can be used alone or can be used together with each other.

To the flame retardant epoxy resin composite that contains phosphorus containing epoxy resin of this invention, organic solvent may be used to adjust the viscosity. As usable organic solvent, amides such as N,N'-dimethylformamide, ethers such as ethyleneglycol mono methyl ether, ketones such as acetone or methylethylketone, alcohols such as methanol or ethanol and aromatic hydrocarbons such as benzene or toluene can be used. One kind or more ones of these solvents may be mixed together with other one and can be blended to the epoxy resin in the limit of 30–80 wt. %.

To the compositions of this invention, a curing accelerator such as tertiary amine, quaternary ammonium salt, phosfine or imidazol can be blended if required.

As the fillers to be used in this invention, inorganic fillers such as aluminium hydroxide, magnesium hydroxide, talk, calcined talk, kaolin, titanium oxide, glass powder or silica balloons can be mentioned, and pigments can be blended. As the reason why the conventional inorganic filler is used, the improvement of impact strength of the above composition can be mentioned. And, when metal hydroxides such as aluminium hydroxide or magnesium hydroxide is used, suitable flame retardance can be mentioned even if the contents of phosphorus is low because it acts as flame retardancy promoting agent. The effect to the impact strength cannot be expected when the blending ratio of the said fillers is to the above composition smaller than 10%. However, if the blending ratio is over 150%, the adhesion of the said composition, which is an essential property for wiring board applications lowers. Furthermore, fibrous fillers such as glass fiber, pulp fiber, synthetic fibers or ceramics fibers or organic fillers such as fine particles of rubber or thermoplastic elastomers can be contained in said resin composition.

A resin sheet preparing method from above mentioned phosphorus containing epoxy resin compositions is illustrated as follows, however, the method to prepare a resin sheet is not restricted by the following description. That is, the above mentioned phosphorus containing epoxy resin compositions are coated over the surface of a carrier film that can not dissolved by the epoxy resin compositions, such as polyester film or polyimide film with desirable thickness of 5–100 $\mu$m then hearted and dried up at 100–200° C. for 1–40 minutes and formed to sheet shape. Namely, this method is usually called as casting method. If the surface of sheet to be coated is previously treated by a release agent before the coating of phosphorus containing epoxy resin compositions, the formed resin sheet can be easily released. The desirable thickness for the formed resin sheet is 5–80 $\mu$m.

A resin clad copper preparation method from above mentioned phosphorus containing epoxy resin compositions is illustrated as follows:

As metal foil, copper, aluminium, brass, nickel, alloy of these metals or composite foil can be used. Desirable thickness of the metal foil to be used is 9–70 $\mu$m. The method to produce metal sheet with resin from flame retardant resin compositions that contain phosphorus-containing epoxy resin and metal foil is not restricted by the above description. That is, for example, resin varnish of the said phosphorus containing epoxy resin composition whose viscosity has been adjusted by adding solvent is coated over one side of above mentioned metal foil by a roll coater. Then the coated surface is heated and dried up so as to make the resin composition semi-cured: (B staging), and to form a resin layer. To make resin composition semi-cured, for example, treatment by heating and drying for 1–40 minutes at 100–200° C. can be mentioned. The desirable thickness of resin parts of resin clad metal is 5–110 $\mu$m.

The prepreg prepared from above mentioned phosphorus-containing epoxy resin composition is illustrated as follows:

As the sheet shape substrate, woven cloth or non-woven cloth of inorganic fiber such as glass or organic fiber e.g. polyester, polyamine, polyacryric, polyimide or kebler can be used, however, not intended to be limited to them. Method to produce a prepreg from flame retardant resin compositions that contain phosphorus containing epoxy resin and a substrate is not restricted by the above description. The said prepreg can be obtained, for example, by impregnating the said substrate into resin varnish of said epoxy resin composition whose viscosity is adjusted by adding a solvent to it, and then the prepreg to make the resin component half hardened (B staging) by heating and drying up. For example, can be dried up by heating for 1–40 minutes at 100–200° C. The desirable resin content in the solid prepreg is 30–80 wt. %.

The method to fabricate a laminated board using above mentioned resin sheet, resin clad metal foil and prepreg is illustrated as follows:

In the case to fabricate a laminated board using a prepreg, one or plural sheets of the prepreg are laminated and then a metal foil is arranged to one or both sides of the laminated prepreg, and the prepreg can be molded by a hot press molding to form one body. As metal foil, copper, aluminium, brass, nickel, alloy of mentioned metals or composite foil can be used. As the hot pressing condition for the laminated substance, a suitable curing condition should be selected for the above epoxy resin compositions. If pressing pressure is too low, there will remain pores in a laminated board and lower the electric properties, it is desirable to press the board by the pressure for molding. For example, each molding conditions can be respectively settled as follows: that is, temperatures; 160–220° C., pressures; 49.0–490.3 N/cm$^2$ (5–50 kgf/cm$^2$), hot pressing time; 40–240 minutes. Moreover, a build-up type printed wiring board can be fabricated by using obtained single layer laminated boards as inner material. In this case, at first, a circuit pattern is formed on the surface of laminated board by an additive process or a subtractive process, and then the circuit formed surface is treated by an acid and finally is treated to black oxide, thus the inner material is obtained. To one or both circuit formed surfaces of said inner material, an insulated layer is formed using resin sheet, resin clad metal or prepreg, and then on the surface of insulated layer, an electro conductive layer is formed, thus the build-up type printed wiring board is obtained. In a case where insulated layer is formed using a resin sheet, a laminated substance is formed by arranging resin sheet on a circuit formed surface of plural inner materials, or, it is formed by arranging resin sheet between a circuit formed surface of inner material and a metal foil. Then the obtained laminated substance is molded by a hot press molding to be one body, and make the cured resin sheet an insulation layer, and then a multi layer inner material, can be obtained from an inner material, a metal foil that is an electric conductive layer and a cured resin sheet that is an insulating layer. As metal foil, the same materials that are used as a laminated board, which is used as an inner material, can be used. Furthermore, a hot press molding can be carried out by the same condition as the inner material forming one. In a case to form an insulating layer by coating resin on a laminated board, after coating phosphorus containing epoxy resin compound or flame retardant epoxy resin composition that contains phosphorus containing epoxy resin desirably by 5–100 $\mu$m thickness on a circuit formed surface of outermost layer of inner material, heated and dried up at 100–200° C. for 1–90 minutes, and then molded to form a sheet shape. The sheet can be formed by a method which is generally called as Casting method. The desirable thickness of the above laminated board is 5–80 $\mu$m after its drying. To the surface of multi layer laminated board formed as above, a hole or circuit pattern is formed by a additive process or a subtractive process and a printed circuit board can be fabricated. When the above mentioned process is repeated using this printed circuit board as inner material, more complicated multi layered board can be fabricated.

Furthermore, in a case to form an insulated layer using resin clad metal foil, a laminated material is formed by arranging the foil on a circuit pattern formed surface of inner material, so as the resin layer is resin clad metal to face the circuit pattern formed surface of inner material. The obtained laminate is molded by a hot press molding to form one body, and it makes the cured resin layer of resin clad metal foil an insulated layer, and the outer metal foil makes an electro conductive layer. The hot press molding can be carried out by the same condition as that of inner material forming. In a case to form an insulation layer using prepreg, one prepreg or a laminated material comprising plural prepregs is arranged to a circuit pattern formed surface of inner material, and a metal foil is arranged to the outer surface. then the obtained laminated substance is molded by a hot press molding to form one body, and it makes cured prepreg an insulated layer, and the outer metal foil makes an electro conductive layer. As metal foil, the same material used in the laminated board, which is used as inner board, can be used. The hot press molding can be carried out by the same condition to that of inner material forming. To the surface of multi layered laminated board formed as above, via hole or circuit pattern is formed by a additive process or a subtractive process and then a printed wiring board can be fabricated. More complicated multi layer board can be formed when the above mentioned process is repeated using this printed wiring board as inner material.

The features of compositions of this invention and the laminated board obtained using said compositions are evaluated. The results show that the prepreg obtained by impregnating phosphorus containing resin compositions prepared by reacting phosphorus containing organic compound (B) obtained by the reaction in the range of molar ratio of 1.01 to 2 moles of organic phosphorus compounds (b) having one active hydrogen atom bonded to phosphorus atom and 1 mole of the said quinone compound, with at least one kind of epoxy resins (C) selected from the groups composed of general formula 1, general formula 2 or general formula 3 with the content of said epoxy resins (C) to be from 20 to 45 wt. % into the above composition, or with novolac type epoxy resins so as the content of said novolac type epoxy resins to be more than 20 wt. % in to the composition, and the laminated board obtained by curing the prepreg, which does not contain halogenated compound, indicates excellent flame resistance, and does not dissociate halogen at elevated temperatures, and further has good adhesion and excellent heat resistance.

EXAMPLE

The present invention can be more readily illustrated by Examples and Comparative Examples, however, are not intended to limit the scope of the claims of this invention.

In Examples and Comparative Examples, flame resistance was measured based on UL (Underwriter Laboratories) Standard. Peel strength of copper clad laminate was measured based on JIS C 6481 5.7 Standard and peel strength (layer to layer) was measured for the laminate on JIS C 6481 5.7, wherein, adhesive strength was measured by peeling one prepreg from other 3 prepregs.

Further, initiating temperature for thermal weight losing and glass transition temperature were measured by means of Exster 6000; product of Seiko Instrument Co., Ltd. Tokyo, Japan.

Synthesis (1)

To a 4 necks separable glass flask equipped with a stirrer, a thermometer, a reflux condenser and a nitrogen gas feeding tee, 212 weight parts of HCA and 470 parts of toluene as solvent was charged, and the mixture is heated to dissolve HCA into the solvent. Then, 100 weight parts of 1,4-naphtoquinone are gradually added to the solution carefully, preventing the reactant from quick raising of temperature with the heat of reaction. In this case, the ratio of HCA, which is phosphorus compound, is 1.56 moles to 1 mole of 4-naphtoquinone. After finishing the reaction, 300 parts of the solvent were recovered, then 160 parts of EPPN-501H (trifunctional epoxy resin, epoxy equivalent; 165 g/eq, a product of Nihon Kayaku Co., Ltd. Tokyo Japan) and 328 weight part of Epotohto YDG-414 (tetrafunctional epoxy resin, epoxy equivalent; 187 g/eq, a product of Tohto Kasei Co., ltd. Tokyo Japan) were added and heated under atmosphere nitrogen gas, with constant stirring, and the solvent was recovered additionally. Afterwards, 200 weight parts of Epotohto ZX-1027 (hydroquinine type epoxy resin, epoxy equivalent; 187 g/eq, a product of Tohto Kasei Co., Ltd. Tokyo, Japan) were added and the temperature was raised to 120° C. to dissolve the said resin. 0.31 parts of triphenylphosphine, which is a catalyst, were added and reacted for 4 hours at 160° C. The content of the claimed epoxy resins represented by general formulae 1, 2 and 3 was 20 wt. %. The epoxy equivalent of the obtained epoxy resin was 401.5 g/eq, and phosphorus content was 3.01 wt. %.

Synthesis (2)

The same process as Synthesis (1) except using 130 weight parts of HCA, 94 weight parts of 1,4-naphtoquinone, 400 weight parts of xylene as solvent, 350 weight parts of EPPN-501H, 250 weight parts ZX-1355 (1,4-dihydroxynaphthalene type epoxy resin, epoxy equivalent; 145 g/eq, product of Tohto Kasei Co., Ltd., Tokyo, Japan) and 176 weight parts of YDH-170 (bisphenol F type epoxy resin, epoxy equivalent; 145 g/eq, product of Tohto Kasei Co., Ltd. Tokyo, Japan) as epoxy resin and 0.22 weight parts of triphenylphosphine as catalyst, were utilized. In this case, phosphorus compound was 1.02 to 1 moles of quinone compound. The content of the claimed epoxys resins was 42.6 wt. %. The epoxy equivalent of the obtained epoxy resin was 273.5 g/eq, and phosphorus content was 1.85 wt. %.

Synthesis (3)

The same process as Synthesis (1) except using 155 weight parts of HCA, 55 weight parts of 1,4-benzoquinone, 220 weight parts of dioxane as solvent, 55 weight parts of YH-434 (tetrafunctional epoxy resin, epoxy equivalent; 129 g/eq, a product of Tohto Kasei Co., Ltd. Tokyo, Japan), 350 weight parts of ZX-1201 (bisphenolfluorene type epoxy resin, epoxy equivalent; 260 g/eq, a product of Tohto Kasei Co., Ltd. Tokyo, Japan) and 385 weight parts of YD-128 (bisphenol A type epoxy resin, epoxy equivalent; 187 g/eq, a product of Tohto Kasei Co., Ltd. Tokyo, Japan) as epoxy resin and 0.21 weight parts of triphenylphosphine as catalyst, were utilized. In this case, phosphorus compound was 1.41 to 1 moles of quinone compound. The content of the claimed epoxys resins was 35.0 wt. %. The epoxy equivalent of the obtained epoxy resin was 391.5 g/eq, and phosphorus content was 2.20 wt. %.

Synthesis (4)

The same process as Synthesis (1) except using 141 weight parts of HCA, 83 weight parts of 1,4-naphtoquinone, 315 weight parts of toluene as solvent, 100 weight parts of YDPN-638 (phenol novolac type epoxy resin, epoxy equivalent; 178 g/eq, difunctional component corresponding to general formula 3, the content of it; 22 wt. %, a product of Tohto Kasei Co., Ltd. Tokyo, Japan) and 325 weight parts ZX-1251 (biphenyl type epoxy resin, epoxy equivalent; 158 g/eq, a product of Tohto Kasei Co., Ltd. Tokyo, Japan) as epoxy resin and 0.22 weight parts of triphenylphosphine as catalyst, were utilized. In this case, phosphorus compound was 1.25 moles to 1 mole of quinone compound. The content of the claimed epoxy resins was 34.5 wt. %. The epoxy equivalent of the obtained epoxy resin was 303.5 g/eq, and phosphorus content was 2.00 wt. %.

Synthesis (5)

The same process as Synthesis (1) except using 141 weight parts of HCA, 92 weight parts of 1,4-naphtoquinone, 320 weight parts of toluene as solvent, 467 weight parts of YDPN-638 and 300 weight parts of YDF-170 as epoxy resin and 0.23 weight parts of triphenylphosphine as catalyst, were utilized. In this case, phosphorus compound was 1.12 moles to 1 mole of quinone compound. The content of the claimed epoxy resins was 40.3 wt. %. The epoxy equivalent of the obtained epoxy resin was 320.1 g/eq, and phosphorus content was 2.00 wt. %.

Synthesis (6)

The same process as Synthesis (1) except using 270 weight parts of HCA, 100 weight parts of 1,4-naphtoquinone, 580 weight parts of toluene as solvent, 100 weight parts of Epotohto ZX-1201, 100 weight parts of Epotohto ZX-1355, 60 weight % of Epotohto YH-434 and 370 weight part of YDPN-638 as epoxy resin, and 0.33 weight parts of triphenylphosphine as catalyst, were utilized. In this case, phosphorus compound was 1.98 moles to 1 mole of quinone compound. The content of the claimed epoxy resins was 28.1 wt. %. The epoxy equivalent of the obtained epoxy resin was 584.7 g/eq, and phosphorus content was 3.83 wt. %.

Synthesis (7)

The same processes as Synthesis (1) except using 90 weight parts of HCA, 65 weight parts of 1,4-naphtoquinone, 200 weight parts of toluene as solvent, 300 weight parts of Epotohto ZX-1355 and 545 weight parts of Epotohto YDPN-638 as epoxy resin, and 0.16 weight parts of triphenylphosphine as catalyst, were utilized. In this case, phosphorus compound is 1.02 to 1 moles of quinone compound. The content of the claimed epoxy resins was 42.0 wt. %. The epoxy equivalent of the obtained epoxy resin was 235.1 g/eq, and phosphorus content was 1.28 wt. %.

Synthesis (8)

The same process as Synthesis (1) except using 141 weight parts of HCA, 55 weight parts of 1,4-naphtoquinone, 300 weight parts of toluene, 814 weight parts of Epotohto YDCN-701 (cresol novolac type epoxy resin, epoxy equivalent was 200 g/eq, a product of Tohto Kasei Co., Ltd. Tokyo, Japan) as epoxy resin, and 0.16 weight parts of triphenylphosphine as catalyst, were utilized. In this case, phosphorus compound was 1.75 to 1 moles of quinone compound. The content of the claimed epoxy resins was not used. The epoxy equivalent of the obtained epoxy resin is 322.0 g/eq, and phosphorus content was 1.86 wt. %.

Synthesis (9)

789 weight parts of Epotohto YDPN-638 and 211 weight parts of HCA is poured into same flask to Synthesis (1) and heated to melt. 0.21 weight parts of triphenylphosphine was used as catalyst. In this Example quinone compound and the claimed epoxy resins was 17.4 wt. %. The epoxy equivalent of the obtained epoxy resin is 291.2 g/eq, and phosphorus content was 3.00 wt. %.

Synthesis (10)

The same process as Synthesis (1) except using 220 weight parts of HCA, 95 weight parts of 1,4-naphtoquinone, 500 weight parts of toluene as solvent, 185 weight parts of Epotohto YD-128 and 500 weight parts of Epotohto YDF-170 as epoxy resin, and 0.32 weight parts of triphenylphosphine as catalyst, were utilized. In this case, phosphorus compound was 1.70 moles to 1 mole of quinone compound. The contents of the claimed epoxy resins was 50.0 wt. %. The epoxy equivalent of the obtained epoxy resin is 428.1 g/eq, and phosphorus content was 3.12 wt. %.

Synthesis (11)

To a 4 necks separable glass flask equipped with a stirrer, a thermometer, a reflux condenser and nitrogen gas feeding tee, 141 weight parts of HCA and 173 parts of ethylcellosolve as solvent were charged, and the mixture is heated to dissolve HCA into the solvent. Then, 87.5 weight parts of 1,4-naphtoquinone were gradually added to the solution carefully, preventing the reactant from quick rising of temperature with the reaction. In this case, the ratio of 1,4-naphtoquinone is 0.85 moles to 1 mole of HCA, which is phosphorus compound. After finishing the reaction, then 771.5 parts of YDPN-638 as novolac type epoxy resin and heated under atmosphere nitrogen gas with constant stirring and the temperature was raised to 120° C. to dissolve the said resin. 0.23 parts of triphenylphosphine, which is a catalyst, was added and reacted for 4 hours at 150° C. The epoxy equivalent of the obtained epoxy resin was 326.9 g/eq, phosphorus content was 2 wt. %. and specific gravity was 1.26.

Synthesis (12)

The same process as Synthesis (11) except using 155 weight parts of HCA, 99.0 weight parts of 1,4-naphtoquinone, 330 weight parts of toluene as solvent, 746.0 weight parts of YDPN-638, and 0.25 weight parts of triphenylphosphine as catalyst, was utilized. In this case, quinone compound was 0.87 moles to 1 mole of phosphorus compound. The epoxy equivalent of the obtained epoxy resin was 360.3 g/eq, phosphorus content was 2.2 wt. %. and specific gravity was 1.26.

Synthesis (13)

The same process as Synthesis (11) except using 141 weight parts of HCA, 41.9 weight parts of 1,4-benzoquinone, 430 weight parts of xylene as solvent, 844.6 weight parts of YDPN-638, and 0.23 weight parts of triphenylphosphine as catalyst, was utilized. In this case, quinone compound was 0.59 moles to 1 mole of phosphorus compound. The epoxy equivalent of the obtained epoxy resin was 300.9 g/eq, phosphorus content was 2 wt. % and specific gravity was 1.25.

Synthesis (14)

The same process as Synthesis (11) except using 141 weight parts of HCA, 25.7 weight parts of 1,4-naphtoquinone, 300 weight parts of toluene as solvent, 833.3 weight parts of YDCN-701 as novolac type epoxy resin, and 0.17 weight parts of triphenylphosphine as catalyst, was utilized. In this case, quinone compound is 0.25 moles to 1 mole of phosphorus compound. The epoxy equivalent of the obtained epoxy resin was 316.6 g/eq, phosphorus content was 2 wt. % and specific gravity was 1.25.

Synthesis (15)

The same process as Synthesis (11) except using 55 weight parts of diphenylphosphineoxide as phosphorus compound, 74.1 weight parts of 1,4-naphtoquinone, 130 weight parts of dioxane as solvent, 870.9 weight parts of YDCN-701 as novolac type epoxy resin, and 0.13 weight parts of triphenylphosphine as catalyst, was utilized. In this case, quinone compound was 0.58 moles to 1 mole of phosphorus compound. The epoxy equivalent of the obtained epoxy resin was 309.1 g/eq, phosphorus content was 2.5 wt. % and specific gravity was 1.26.

Synthesis (16)

The same process as Synthesis (11) except using 141 weight parts of HCA, 96.3 weight parts of 1,4- naphtoquinone, 300 weight parts of toluene as solvent, 262.7 weight parts of YDPN-638 and 409.6 weight parts of YDF-170 as novolac type epoxy resin, and 0.24 weight parts of triphenylphosphine as catalyst, was utilized. In this case, quinone compound was 0.93 moles to 1 mole of phosphorus compound. The epoxy equivalent of the obtained epoxy resin was 323.0 g/eq, phosphorus content was 2 wt. % and specific gravity was 1.26.

Synthesis (17)

The same process as Synthesis (11) except using 256 weight parts of diphenylphosphineoxide and 600 parts of ethylcellosolve as solvent was charged, and the mixture was heated to dissolve diphenylphosphineoxide into the solvent. Then, 48.6 weight parts of 1,4-benzoquinone is gradually added to the solution carefully, preventing the reactant from quick raising of temperature with the reaction. In this case, the ratio of 1,4-benzoquinone was 0.89 moles to 1 mole of diphenylphosphineoxide, which is phosphorus compound.

The obtained crystal product after the reaction was separated by filtering and was recrystallized in methyl alcohol to make a powder. This powder was obtained by drying and then analyzed by liquid chromatography. There are no peaks of diphenylphosphineoxide and 1,4-benzoquinone, and the powder was identified from molecular weight with bifunctional phenolic compound in which diphenylphosphineoxide and 1,4-benzoquinone were reacted.

Then 200 weight parts of the recrystsllized powder, 300 weight parts of YDPN-638, 500 weight parts of YD-128 and 0.20 weight parts of triphenylphosphine as catalyst, were added and reacted. The epoxy equivalent of the obtained epoxy resin was 308.4 g/eq, phosphorus content was 2 wt. %, and specific gravity was 1.25.

Syntheses (18)

The same process as Synthesis (11) except using 282 weight parts of HCA and 660 parts of ethylcellosolve as solvent was charged, and the mixture is heated to dissolve HCA into the solvent. Then, 192.6 weight parts of 1,4-naphtoquinone was gradually added to the solution carefully, preventing the reactant from quick raising of temperature with the reaction. In this case, the ratio of HCA, which is phosphorus compound, was 1.07 moles to 1 mole of 1,4-naphtoquinone. After finishing the reaction, the product was filtered off and recrystallized with methyl alcohol. The obtained crystal product after the reaction was separated by filtering and was recrystallized in the methyl alcohol to make a powder. This powder was obtained by drying and then analyzed by liquid chromatography, There are no peaks of diphenylphosphineoxide and 1,4-benzoquinone, and the powder was identified from molecular weight with bifunctional phenolic compound in which diphenylphosphineoxide and 1,4-benzoquinone were reacted.

And then 243.9 weight parts of the powder, 300 weight parts of YDPN-638, 300 weight parts of YDF-170 and 0.24 weight parts of triphenylphosphine as catalyst, were added and reacted. The epoxy equivalent of the obtained epoxy resin was 337.0 g/eq, phosphorus content was 2 wt. %, and specific gravity was 1.25.

Synthesis (19)

The same process as Synthesis (11) except using 209 weight parts of HCA as phosphorus compound, 30 weight parts of bisphenol A, 761 weight parts of YDCN-638 as novolac type epoxy resin, and 0.2 weight parts of triphenylphosphine as catalyst, was utilized. In this case, quinone compound was not used. The epoxy equivalent of the obtained epoxy resin was 350.8 g/eq, phosphorus content was 3.0 wt. %, and specific gravity was 1.26.

Synthesis (20)

The same process as Synthesis (11) except using 141 weight parts of HCA, 56.6 weight parts of 1,4-benzoquinone, 150 weight parts of YDCN-702, 652.4 weight parts of YD-128 and, and 0.20 weight parts of triphenylphosphine as catalyst, was utilized. In this case, phosphorus compound was 1.25 moles to 1 mole of quinone compound. The epoxy equivalent of the obtained epoxy resin was 327.1 g/eq, phosphorus content was 2 wt. %, and specific gravity was 1.24.

Synthesis (21)

The same process as Synthesis (11) except using 141 weight parts of HCA, 104.3 weight parts of 1,4-benzoquinone, 754.7 weight parts of YDPN-638, and 0.25 weight parts of triphenylphosphine as catalyst, was utilized. In this case, phosphorus compound was 0.99 moles to 1 mole of quinone compound. The epoxy equivalent of the obtained epoxy resin was 340.5 g/eq, phosphorus content was 2 wt. %, specific gravity was 1.25, and specific gravity was 1.25. The obtained epoxy resin was analyzed by liquid chromatography. As a result of this analysis it was identified that there were peak of HCA and 1,4-naphtoquinone, especially it was confirmed that there still remained massive 1,4-naphtoquinone.

Examples 1–12, 16 and Comparative Examples 1–7

* Preparation of Prepreg

Concerning Examples 1–12, 16, and Comparative Example 1–7, resin vanishes shown in Tables 1, 2 and 3 were prepared, and glass cloth (product of Nitto Spinning Co., Ltd.; 7628 type; a product number H258 Tokyo, Japan) were impregnated into these resin varnishes, and heated for 5 minutes at 155° C. and finally dried up, thus prepreg specimens were obtained.

In these Tables, the term of [Dicy] is dicyandiamide (a product of Nihon Carbide Co., Ltd. Tokyo, Japan), [PSM4357] is a phenol novolac (a product of Gunei Chemicals Co., Ltd.; product No. PSM4357 Takasaki, Japan), [2E4MZ] is 2-ethyl-4-methylimidasol (a product of Shikoku Kasei Co., Ltd. Tokyo, Japan; a product No. 2E4MZ), [aluminium hydroxide] is a product of Sumitomo Chemicals Co., Ltd. Tokyo, Japan; product No. CL-310, [magnesium hydroxide] is the $1^{st}$ chemical grade reagent, [Wollastonite] is a product of Kinseimatec Co., Ltd.,: product No. FPW-800 and [XER-91] is fine particles of bridged NBR (acrylonitrile.butadiene rubber) product No. XER-91.

* Preparation of Inner Material

A prepreg for inner material was prepared by above mentioned method.

Three sheets of the prepeg were laminated, and copper foil (product of Furukawa Circuit Foil Co., Ltd. Tokyo, Japan; product No. GT foil) with 18 $\mu$m thick was arranged to both surfaces of the laminate to a laminate product.

The obtained laminate product was molded by a hot press with a pressure of 392 N/cm$^2$ (40 kgf/cm$^2$), 170° C. for 120 minutes to a laminated board for inner material. On both surfaces of this laminated board, a circuit pattern was formed by a subtractive process, and through holing was made. There, furthermore the circuit surface was treated by acid and was treated with black oxide, thus the printed circuit board for the inner material was prepared.

* Preparation of Multi Layer Board

On the both surfaces of above mentioned printed circuit board (for the inner material), one sheet of the above prepreg was laminated to a prepreg-laminate and then one sheet of copper foil with 18 $\mu$m thick was layered to each surface of it, thus a laminate product was prepared.

All of each surface of the laminate product was etched thoroughly and each one of the above mentioned prepreg was arranged to both etched surfaces to a prepreg-etched laminate and then each sheet of copper foils with 18 μm thick was layered on the each outer side of above etched laminate to prepare a multi layer board product for characterizing its flame retardancy.

The obtained laminate product was molded by hot press with a pressure of 392 N/cm² (40 kgf/cm²), at 170° C. for 120 minutes to a multi layer board.

Example 13
* Preparation of Resin Clad Copper

A resin varnish shown in Table 2 was prepared for Example 13 and coated to one surface of copper foil (a product of Furukawa Electric Industries Co., Ltd. Tokyo, Japan; trademark of GT foil) with 18 urn thick, and then heated to dry up solvent contained at 160°0 C. for 10 minutes, and resin clad copper foils whose resin part thickness is 60 μm were obtained.
* Preparation of Inner Material The inner layer material obtained in Example 1 was used.
* Preparation of Multi Layer Board The inner layer material obtained in Example 1 was used.

The inner layer and the above resin clad copper foil were arranged to laminate so that each resin layer side of two sheets of the latter was faced to both of the circuit pattern formed surfaces.

All of each surface of the above laminate was etched thoroughly and each one of the above mentioned prepreg was arranged to both etched surfaces to a prepreg-etched laminate and then each sheet of copper foils with 18 μm thick was layered on the each outer side of the etched laminate to prepreg a board product for characterizing its flame reterdancy.

The obtained laminated substance was molded by heat press by 98 N/cm² (10 kgf/cm²), 170° C. condition for 120 minutes and a multi layer board was prepared.

Example 14
* Preparation of Resin Sheet

In Example 14, resin vanish shown in Table.2 was prepared and coated on the surface of polyethyleneterephtalate film whose surface is coated with a release agent by a bar coater. And then was heated to dry up solvent contained 160° C. for 10 minutes. By removing polyethyleneterephtalate film, a resin sheet of 160 μm thick was obtained when the film was removed.
* Preparation of Inner Material The inner layer material obtained in Example 1 was used.
* Preparation of Multi Layer Board To the both surfaces of above mentioned resin sheet, a circuit formed inner material was arranged to a laminate. To the outer surface, a resin sheet and copper foil (product of Furukawa Electric Industries Co., Ltd. Tokyo, Japan; trademark of GT foil) with 18 μm thick was arranged, to a laminated product.

A layer board product to characterize its flame retardancy was prepared in accordance with the same procedure as described in example 13 except using the resin sheets for example 10.

The prepared board product was molded by a hot press with a pressure of 98 N/cm² (10 kgf/cm²), at 170° C. for 120 minutes to a multi layer board.

Example 15
* Preparation of Inner Material

The inner layer material obtained in Example 1 was used.
* Preparation of Multi Layer Board In Example 15, resin vanish shown in Table.2 is prepared and coated on the surface of above mentioned inner material on which circuit pattern was formed by a bar coater. And then was heated to dry up dried up at 160 for 10 minutes. To the outer surface, a sheet of copper foil (a product of Furukawa Electric Industries Co., Ltd. Tokyo, Japan; trademark of GT foil) with 18 μm thick was arranged, and molded by hot press with a pressure of 98 N/cm² (10 kgf/cm²), at 170° C. for 120 minutes to a multi layer board. Both surfaces of the board were etched thoroughly to characterize its flame reterdancy in accordance with the procedure described in Example 13.

Examples 17–24 and Comparative Examples 8–11

Concerning Examples 17–24 and Comparative Example 7–10, 100 weight parts of obtained epoxy resins, 3.21 weight parts of dicyandiamide, 0.01 weight parts of 2-ethyl-4-methylimidasol, were uniformly solved in a solvent consisting of methylethyl ketone, methylcellosolve, dimethylformamide, and then each of above resin varnishes was obtained. A glass cloth (a product of Nitto Spinning Co., Ltd.; 7628 type; trade name XS13 Tokyo, Japan) was impregnated into each of resin varnishes. Each impregnated glass cloth from each of the above resin varnishes was dried in a hot-air oven for 4 minutes at 150° C. to obtain to each prepreg. Eight sheets of each prepeg were laminated, and copper foil (product of Furukawa Circuit Foil Co., Ltd. Tokyo, Japan; trade name GT foil) with 18 μm thick was arranged to both surfaces of the laminate to a laminate product. The obtained laminate product was molded by hot press with 130° C. for 150 minutes and a pressure of 196 N/cm² (20 kgf/cm²), 170° C. for 70 minutes to a laminated board.

In these Tables, the term of [Dicy] is dicyandiamide (product of Nihon Carbide Co., Ltd. Tokyo, Japan), [2E4MZ] is 2-ethyl-4-methylimidasol (product of Shikoku Kasei Co., Ltd. Tokyo, Japan; product No. 2E4MZ).

TABLE 1

|  | Example | | | | | | | |
| --- | --- | --- | --- | --- | --- | --- | --- | --- |
|  | 1 | 2 | 3 | 4 | 5 | 6 | 7 | 8 |
|  | Formulation ratio | | | | | | | |
| Resin parts of Synthesis (1) | 100 | | | | | | | |
| Resin parts of Synthesis (2) |  | 100 | | | | | | |
| Resin parts of Synthesis (3) |  |  | 100 | | | | 100 | |
| Resin parts of Synthesis (4) |  |  |  | 100 | | | | |
| Resin parts of Synthesis (5) |  |  |  |  | 100 | 100 | | 100 |
| Resin parts of Synthesis (6) |  |  |  |  |  |  |  |  |
| Resin parts of Synthesis (7) |  |  |  |  |  |  |  |  |
| YD-128 |  |  |  |  |  |  | 11.1 |  |
| YDCN-704 |  |  |  |  |  |  |  | 80 |

TABLE 1-continued

|  | Example | | | | | | | |
| --- | --- | --- | --- | --- | --- | --- | --- | --- |
|  | 1 | 2 | 3 | 4 | 5 | 6 | 7 | 8 |
| Dicy | 2.62 | 3.84 | 2.68 | 3.46 | 3.28 | 3.9 | 2.68 | 7.34 |
| PSM4357 |  |  |  |  |  |  |  |  |
| 2E4MZ | 0.01 | 0.05 | 0.3 | 0.1 | 0.05 | 0.06 | 0.3 | 0.18 |
| DMF | 60.3 | 61 | 60.5 | 61 | 61 | 67.5 | 78 |  |
| Magnesium hydroxide |  |  |  |  |  |  |  | 150 |
| Aluminium hydroxide |  |  |  |  |  |  |  |  |
| Wollastonite |  |  |  |  |  |  | 30 |  |
| XER91 |  |  |  |  |  |  |  |  |
| Resin in Examples | | | | | | | | |
| P content in phosphorus containing epoxy resin (A) (wt %) | 3.01 | 1.85 | 2.2 | 2 | 2 | 2 | 2.2 | 2 |
| Claimed epoxy resin (wt %) | 20 | 42.6 | 35 | 34.7 | 40.3 | 40.3 | 35 | 40.3 |
| Molar ratio:phosphorus compound to 1 mole of quinone compound | 1.56 | 1.02 | 1.41 | 1.25 | 1.12 | 1.12 | 1.41 | 1.12 |
| Characterization of laminated board | | | | | | | | |
| Flame retardance UL-94 | V-0 | V-0 | V-0 | V-0 | V-0 | V-0 | V-0 | V-0 |
| peel strength (kN/m) | 1.3 | 1.5 | 1.5 | 1.3 | 1.3 | 1.4 | 1.4 | 1.2 |
| Peel strength (layer to layer) (kN/m) | 1.1 | 1.2 | 1.2 | 1 | 1 | 1.1 | 1.1 | 0.9 |
| Initiation temperature for Thermal decomposition (° C.) | 322.8 | 351.0 | 333.4 | 329.8 | 338.3 | 328.8 | 250/ 333.4 | 331.5 |
| Tg (° C.) | 134 | 152 | 142 | 135 | 138 | 142 | 142 | 138 |
| P content in epoxy resin composition (a) (wt %) | 2.93 | 1.78 | 2.14 | 1.93 | 1.94 | 1.74 | 1.65 | 0.59 |
| Bromine content in epoxy resin composition (a) (wt %) | 0 | 0 | 0 | 0 | 0 | 0 | 0 | 0 |

*claimed epoxy resin: represented by general formulae 1, 2 and 3
*initiation temperature of Example 7,
initiation temperature of decomposing thermally Al(OH)$_3$ was 250° C.
thermal decomposition temperature of the resin to be tested: 333° C.
*YDCN-704: product of Tohto Kasei Co., Ltd. ortho-cresol type epoxy resin, epoxy equivalent was 205 g/eq

TABLE 2

|  | Example | | | | | | | |
| --- | --- | --- | --- | --- | --- | --- | --- | --- |
|  | 9 | 10 | 11 | 12 | 13 | 14 | 15 | 16 |
| Formulation ratio | | | | | | | | |
| Resin parts of Synthesis (1) |  |  |  |  | 100 | 100 | 100 |  |
| Resin parts of Synthesis (2) | 100 |  |  |  |  |  |  |  |
| Resin parts of Synthesis (3) |  |  |  |  |  |  |  |  |
| Resin parts of Synthesis (4) |  |  |  |  |  |  |  |  |
| Resin parts of Synthesis (5) |  | 100 |  |  |  |  |  |  |
| Resin parts of Synthesis (6) |  |  | 100 |  |  |  |  | 100 |
| Resin parts of Synthesis (7) |  |  |  | 100 |  |  |  |  |
| YD-128 |  |  |  |  |  |  |  | 4.4 |
| YDCN-704 |  |  |  |  |  |  |  |  |
| Dicy | 3.84 |  | 1.8 | 4.47 | 2.62 | 2.62 | 2.62 | 2.1 |
| PSM4357 |  | 34.6 |  |  |  |  |  |  |
| 2E4MZ | 0.05 | 0.06 | 0.05 | 0.02 | 0.01 | 0.01 | 0.01 | 0.04 |
| DMF | 67 | 79.1 | 61 | 67 | 62.4 | 130.7 | 42.1 |  |
| Magnesium hydroxide |  |  |  |  |  |  |  |  |
| Aluminium hydroxide |  | 11 |  |  |  |  |  |  |
| Wollastonite |  |  |  |  |  |  |  |  |
| XER91 |  |  |  |  | 3.6 | 120 |  |  |
| Resin in Examples | | | | | | | | |
| P content in phosphorus containing epoxy resin (A) (wt %) | 1.85 | 2 | 3.83 | 1.28 | 3.01 | 3.01 | 3.01 | 3.83 |
| Claimed epoxy resin (wt %) | 42.6 | 40.3 | 28.1 | 42 | 20 | 20 | 20 | 28.1 |
| Molar ratio:phosphorus compound to 1 mole of quinone compound | 1.02 | 1.12 | 1.98 | 1.02 | 1.56 | 1.56 | 1.56 | 1.98 |

TABLE 2-continued

| | Example | | | | | | | |
|---|---|---|---|---|---|---|---|---|
| | 9 | 10 | 11 | 12 | 13 | 14 | 15 | 16 |
| Characterization of laminated board | | | | | | | | |
| Flame retardance UL-94 | V-0 | V-0 | V-0 | V-0 | V-0 | V-0 | V-0 | V-0 |
| peel strength (kN/m) | 1.4 | 1.1 | 1.5 | 1.1 | 1.3 | 1.5 | 1.3 | 1.7 |
| Peel strength (layer to layer) (kN/m) | 1.1 | 0.9 | 1.1 | 0.9 | | | 1 | 1.3 |
| Initiation temperature for Thermal decomposition (° C.) | 341.0 | 339.5 | 335.8 | 323.3 | 322.8 | 322.8 | 322.8 | 331.0 |
| Tg (° C.) | 152 | 129 | 132 | 156 | 132 | 129 | 134 | 134 |
| P content in epoxy resin composition (a) (wt %) | 1.61 | 1.48 | 3.76 | 1.22 | 2.83 | 1.35 | 2.93 | 3.6 |
| Bromine content in epoxy resin composition (a) (wt %) | 0 | 0 | 0 | 0 | 0 | 0 | 0 | 0 |

TABLE 3

| | Example | | | | | | | |
|---|---|---|---|---|---|---|---|---|
| | 17 | 18 | 19 | 20 | 21 | 22 | 23 | 24 |
| Formulation ratio | | | | | | | | |
| Resin parts of Synthesis (11) | 100 | | | | | | | |
| Resin parts of Synthesis (12) | | 100 | | | | | | |
| Resin parts of Synthesis (13) | | | 100 | | | | | |
| Resin parts of Synthesis (14) | | | | 100 | | | | |
| Resin parts of Synthesis (15) | | | | | 100 | | | |
| Resin parts of Synthesis (16) | | | | | | 100 | | |
| Resin parts of Synthesis (17) | | | | | | | 100 | |
| Resin parts of Synthesis (18) | | | | | | | | 100 |
| Dicy | 3.21 | 2.91 | 3.49 | 3.32 | 3.40 | 3.25 | 3.40 | 3.11 |
| 2E4MZ | 0.01 | 0.01 | 0.02 | 0.01 | 0.01 | 0.15 | 0.05 | 0.15 |
| Resin in Examples | | | | | | | | |
| Specific gravity of epoxy resin | 1.26 | 1.26 | 1.25 | 1.25 | 1.26 | 1.26 | 1.25 | 1.26 |
| P content in phosphorus containing epoxy resin (A) (wt %) | 1.9 | 2.1 | 1.9 | 2.0 | 2.4 | 1.9 | 1.9 | 1.9 |
| Bromine content in epoxy resin composition (a) (wt %) | 0 | 0 | 0 | 0 | 0 | 0 | 0 | 0 |
| Novolac type epoxy resin (wt %) | 77.1 | 74.6 | 84.4 | 83.3 | 87.1 | 26.3 | 30.0 | 45.6 |
| Molar ratio: quinone compound to 1 mole of phosphorus compound | 0.85 | 0.87 | 0.59 | 0.25 | 0.58 | 0.93 | 0.89 | 0.93 |
| Characterization of laminated board | | | | | | | | |
| Flame reterdance UL-94 | V-0 | V-0 | V-0 | V-0 | V-0 | V-0 | V-0 | V-0 |
| Peel strength (kN/m) | 1.6 | 1.5 | 1.6 | 1.4 | 1.5 | 1.6 | 1.7 | 1.5 |
| Initiation temperature for thermal decomposition (° C.) | 332.8 | 332.2 | 347.1 | 325.1 | 350.3 | 332.8 | 363.6 | 337.2 |
| Tg (° C.) | 139 | 132 | 132 | 138 | 140 | 132 | 129 | 132 |

TABLE 4

| | Comparative Example | | | | | | |
|---|---|---|---|---|---|---|---|
| | 1 | 2 | 3 | 4 | 5 | 6 | 7 |
| Formulation ratio | | | | | | | |
| Resin parts of Synthesis (5) | | | | | 100 | 100 | |
| Resin parts of Synthesis (8) | | 100 | | | | | |
| Resin parts of Synthesis (9) | | | 100 | | | | |
| Resin parts of Synthesis (10) | | | | 100 | | | |
| YDB-500 | 90 | | | | | | 94 |
| YDCN-704 | 10 | | | | 80 | 80 | |
| YDB-400 | | | | | | | 6 |
| Dicy | 2.38 | 3.26 | 3.61 | 2.45 | 7.34 | 7.34 | |

TABLE 4-continued

|  | Comparative Example | | | | | | |
| --- | --- | --- | --- | --- | --- | --- | --- |
|  | 1 | 2 | 3 | 4 | 5 | 6 | 7 |
| PSM4357 |  |  |  |  |  |  | 22.39 |
| 2E4Mz | 0.06 | 0.1 | 0.4 | 0.5 | 0.18 | 0.18 | 0.06 |
| DMF | 60 | 61 | 61 | 60 | 110 | 222 |  |
| Magnesium hydroxide |  |  |  |  |  | 190 |  |
| Wollastonite |  |  |  |  |  |  |  |
| XER91 |  |  |  |  |  |  |  |
| Resin in Examples | | | | | | | |
| P content in phosphorus containing epoxy resin (A) (wt %) | — | 1.86 | 3 | 3.12 | 2 | 2 | — |
| Claimed epoxy resin (wt %) | 0 | 0 | 17.4 | 50 | 40.3 | 40.3 | 0 |
| Molar ratio: phosphorus compound to 1 mole of quinone compound | — | 1.75 | — | 1.70 | 1.12 | 1.12 | — |
| Characterization of laminated board | | | | | | | |
| Flame retardance UL-94 | V-0 | V-1 | V-0 | V-0 | V-1 | V-0 | V-0 |
| Peel strength (kN/m) | 1.5 | 1.1 | 1.1 | 1.3 | 1.3 | 0.9 | 1.3 |
| Peel strength (layer to layer) (kN/m) | 1.1 | 0.4 | 0.5 | 0.7 | 1 | 0.5 | 1 |
| Initiation temperature for thermal decomposition (° C.) | 301.3 | 325.8 | 335.6 | 325.2 | 334.5 | 331.6 | 314 |
| Tg (° C.) | 132 | 128 | 110 | 98 | 138 | 138 | 133 |
| P content in epoxy resin composition (a) (wt %) | 0 | 1.8 | 2.88 | 3.03 | 1.1 | 0.59 | 0 |
| Bromine content in epoxy resin composition (a) (wt %) | 18.9 | 0 | 0 | 0 | 0 | 0 | 18.9 |

YDB-500: product of Tohto Kasei Co., Ltd. brominated bisphenol A type epoxy resin, epoxy equivalent; 500 g/eq, Br content; 21 wt. %
YDB-400; product of Tohto Kasei Co., Ltd. brominated bisphenol A type epoxy resin, epoxy equivalent; 400 g/eq, Br content; 49 wt. %

TABLE 5

|  | Comparative Example | | | |
| --- | --- | --- | --- | --- |
|  | 8 | 9 | 10 | 11 |
| Formulation ratio | | | | |
| Resin parts of Synthesis (19) |  | 100 |  |  |
| Resin parts of Synthesis (20) |  |  | 100 |  |
| Resin parts of Synthesis (21) |  |  |  | 100 |
| YDB-500 | 90 |  |  |  |
| YDCN-704 | 10 |  |  |  |
| Resin parts of Synthesis (16) |  |  |  |  |
| Resin parts of Synthesis (17) |  |  |  |  |
| Resin parts of Synthesis (18) |  |  |  |  |
| Dicy | 2.16 | 3 | 3.21 | 3.08 |
| 2E4MZ | 0.50 | 0.65 | 0.05 | 0.05 |
| Resin in Examples | | | | |
| Specific gravity of epoxy resin | 1.39 | 1.26 | 1.24 | 1.25 |
| P content in phosphorus containing epoxy resin (A) (wt %) | 0 | 2.9 | 1.9 | 1.9 |
| Bromine content in epoxy resin composition (a) (wt %) | 18.9 | 0 | 0 | 0 |
| Novolac type epoxy resin (wt %) | 10.0 | 76.1 | 15.0 | 75.5 |
| Molar ratio: quinone compound to 1 mole of phosphorus compound | — | 0.00 | 0.80 | 1.01 |
| Characterization of laminated board | | | | |
| Flame reterdance UL-94 | V-0 | V-0 | V-0 | V-0 |
| Peel strength (kN/m) | 2.1 | 1.2 | 1.3 | 0.6 |
| Initiation temprature for thermal decomposition (° C.) | 301.3 | 334.6 | 324.4 | 163.8 |
| Tg(° C.) | 132 | 109 | 107 | 99 |

YDCN-704; product of Tohto Kasei Co., Ltd. ortho-cresol novolac type epoxy resin, epoxy equivalent; 203/eq Effectiveness of the Present Invention As clearly understood from the characterization in Table 3, even if the phosphorus containing epoxy resin which applies part of technological philosophy of the present invention, the phosphorus containing epoxy resin whose content of at least one kind of epoxy resin (C) selected from the groups composed of general formula 1, general formula 2 and general formula 3 is smaller than 20 wt. % or bigger than 40 wt. % can not give good adhesion and high heat resistance, and the said phosphorus containing epoxy resin whose content of novolac type epoxy resin is smaller than 20 wt. % can not give good flame retardant and high heat resistance. Furthermore, the compositions that use reaction product of organic phosphorus compound (b) and epoxy resin with no use of quinone give worse adhesion and lower heat resistance. The compositions of the present invention have not only higher glass transition temperature, but also the thermal decomposition temperature of the compositions is higher in comparison with the conventional bromine containing epoxy resin based flame retardants. This means that the product of this invention has more excellent heat resistance for long-term use.

As mentioned above, although the flame retardant epoxy resin compositions that contain phosphorus containing epoxy resin of the present invention does not contain halogen, shows excellent flame reterdance and also gives good heat resistance and adhesion, and therefore, is suited well for the printed wiring applications based on copper clad laminate.

What is claimed is:

1. A phosphorus containing epoxy resin composition (a) comprising a phosphorus containing epoxy resin (A) and a hardener, said phosphorus containing epoxy resin (A) comprising
  the reaction product of a phosphorus containing organic compound (B) and
  at least an epoxy resin (C);
  wherein the epoxy equivalent of phosphorous containing epoxy resin (A) is 300–500 g/eq
  wherein (B) is the reaction product of organic phosphorus compounds (b) having one active hydrogen atom bonded to a phosphorus atom and a quinone compound, said reaction product containing an unreacted component, said reaction product formed with a molar ratio of (b) to quinone of 1.25:1 to 2:1 and containing an excess of organic phosphorous compounds (b) as said unreacted component, wherein (C) is selected from the group, consisting of resins represented by formula 1, formula 2 and formula 3 wherein the content of said epoxy resins (C) comprises from 20 to 45 wt. % of (A),

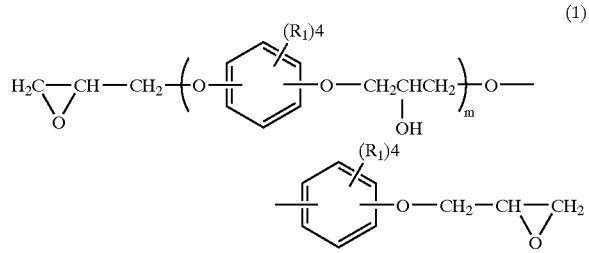

(1)

wherein $R_1$ is a hydrogen atom and/or a phenyl group, m is an integer including 0,

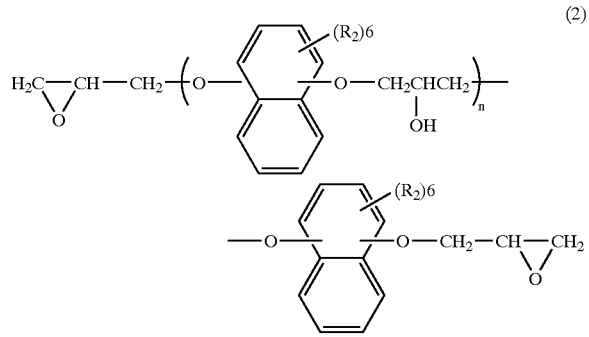

(2)

wherein $R_2$ is a hydrogen atom and/or a phenyl group, n is an integer including 0,

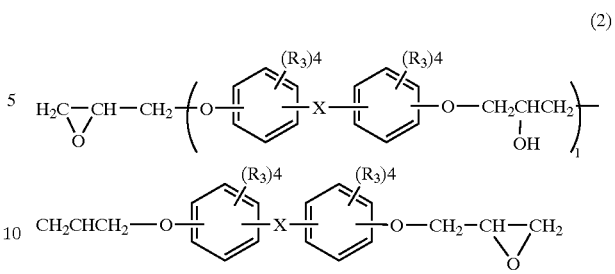

(2)

wherein $R_3$ is a hydrogen atom and/or a phenyl group, l is an integer including 0, wherein X is selected from the group consisting of —$CH_2$—, —O—, —CO—, —$SO_2$—, —S—, —CH($C_6H_5$)—, —C($C_6H_5$)$_2$—, a bond and a structure represented by formula 4

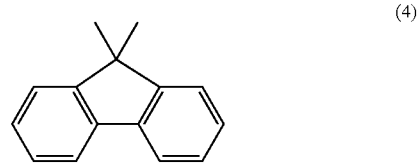

(4)

2. The phosphorus containing epoxy resin compositions in accordance with claim 1, wherein the phosphorus content in phosphorous containing epoxy resin (A) is from 1.2 to 4 wt. %.

3. The phosphorus containing epoxy resin composition in accordance with claim 2 wherein the organic phosphorus compound (b) having one active hydrogen atom bonded to a phosphorus atom is 3,4,5,6-dibenzo-1,2-oxaphosphane-2-oxide.

4. The phosphorus containing epoxy resin composition in accordance with claim 2 wherein the quinone compound is 1,4-benzoquinone and/or 1,4-naphthoquinone.

5. The phosphorus containing epoxy resin composition in accordance with claim 4 wherein the organic phosphorus compound (b) having one active hydrogen atom bonded to a phosphorus atom is 3,4,5,6-dibenzo-1,2-oxaphosphane-2-oxide.

6. The phosphorus containing epoxy resin composition in accordance with claim 1 wherein the quinone compound is 1,4-benzoquinone and/or 1,4-naphthoquinone.

7. The phosphorus containing epoxy resin composition in accordance with claim 6 wherein the organic phosphorus compound (b) having one active hydrogen atom bonded to a phosphorus atom is 3,4,5,6-dibenzo-1,2-oxaphosphane-2-oxide.

8. The phosphorus containing epoxy resin composition in accordance with claim 1 wherein the organic phosphorus compound (b) having one active hydrogen atom bonded to a phosphorus atom is 3,4,5,6-dibenzo-1,2-oxaphosphane-2-oxide.

9. A flame retardant epoxy resin composition comprising the phosphorus containing epoxy resin composition of claim 1 and having a phosphorus content in epoxy resin composition (a) of from 0.5 to 4.0 wt %.

10. The flame retardant epoxy resin composition according to claim 9, wherein the organic phosphorus compound (b) having one active hydrogen atom bonded to a phosphorus atom is 3,4,5,6-dibenzo-1,2-oxaphosphane-2-oxide.

11. The flame retardant epoxy resin composition of claim 9 wherein the phosphorus containing epoxy resin (A) has a phosphorus content of from 1.2 to 4 wt %.

12. The flame retardant epoxy resin composition according to claim 11, wherein the organic phosphorus compound (b) having one active hydrogen atom bonded to a phosphorus atom is 3,4,5,6-dibenzo-1,2-oxaphosphane-2-oxide.

13. The flame retardant epoxy resin composition of claim 11 wherein the quinone compound is 1,4-benzoquinone and/or 1,4-naphthoquinone.

14. The flame retardant epoxy resin composition according to claim 13, wherein the organic phosphorus compound (b) having one active hydrogen atom bonded to a phosphorus atom is 3,4,5,6-dibenzo-1,2-oxaphosphane-2-oxide.

15. The flame retardant epoxy resin composition of claim 9 wherein the quinone compound is 1,4-benzoquinone and/or 1,4-naphthoquinone.

16. The flame retardant epoxy resin composition according to claim 15, wherein the organic phosphorus compound (b) having one active hydrogen atom bonded to a phosphorus atom is 3,4,5,6-dibenzo-1,2-oxaphosphane-2-oxide.

17. The flame retardant epoxy resin composition of claim 9 further comprising 10–150 weight parts of inorganic filler per 100 weight parts of solid epoxy resin.

18. The flame retardant epoxy resin composition of claim 17 wherein the inorganic filler is at least one of the group composed of aluminum hydroxide, magnesium hydroxide, talc, calcined talc, kaolin, titanium oxide, glass powder and silica balloon.

19. The phosphorus containing epoxy resin composition of claim 1 further comprising 10–150 weight parts of inorganic filler per 100 weight parts of solid epoxy resin.

20. The phosphorus containing epoxy resin composition of claim 19 wherein the inorganic filler is at least one of the group composed of aluminum hydroxide, magnesium hydroxide, talc, calcined talc, kaolin, titanium oxide, glass powder and silica balloon.

21. A resin sheet prepared from the phosphorus containing epoxy resin composition of claim 1.

22. A resin clad metal foil prepared by coating a metal foil with the phosphorus containing epoxy resin composition of claim 1.

23. A prepreg prepared by soaking a substrate in the phosphorus containing epoxy resin composition of claim 1.

24. A laminated board prepared by bonding a plurality of sheets together, wherein the sheets comprise at least one of a resin sheet prepared from the phosphorus containing epoxy resin composition of claim 1, a resin clad metal foil prepared by coating a metal foil with the phosphorus containing epoxy resin composition of claim 1, or a prepreg prepared by soaking a substrate in the phosphorus containing epoxy resin composition of claim 1.

25. A multi layer board prepared by coating a laminated substrate with the phosphorus containing epoxy resin composition of claim 1.

* * * * *